(12) United States Patent
An

(10) Patent No.: US 8,817,532 B2
(45) Date of Patent: Aug. 26, 2014

(54) SEMICONDUCTOR MEMORY APPARATUS, AND SET PROGRAM CONTROL CIRCUIT AND PROGRAM METHOD THEREFOR

(75) Inventor: Yong Bok An, Ichon-shi (KR)

(73) Assignee: SK Hynix Inc., Gyeonggi-do (KR)

(*) Notice: Subject to any disclaimer, the term of this patent is extended or adjusted under 35 U.S.C. 154(b) by 177 days.

(21) Appl. No.: 13/445,755

(22) Filed: Apr. 12, 2012

(65) Prior Publication Data

US 2013/0135949 A1 May 30, 2013

(30) Foreign Application Priority Data

Nov. 25, 2011 (KR) .................... 10-2011-0124596

(51) Int. Cl.
*G11C 11/00* (2006.01)

(52) U.S. Cl.
USPC .. 365/163; 365/189.09; 365/191; 365/230.06

(58) Field of Classification Search
USPC .................. 365/163, 189.09, 230.06, 191
See application file for complete search history.

(56) References Cited

U.S. PATENT DOCUMENTS

| | | | | |
|---|---|---|---|---|
| 7,349,245 B2* | 3/2008 | Kim et al. | ...................... | 365/158 |
| 7,511,993 B2* | 3/2009 | Choi et al. | ..................... | 365/163 |
| 7,580,278 B2* | 8/2009 | Cho et al. | ...................... | 365/163 |
| 7,646,632 B2* | 1/2010 | Philipp et al. | .................. | 365/163 |
| 7,864,619 B2* | 1/2011 | Cho et al. | .................. | 365/230.06 |
| 7,936,619 B2 | 5/2011 | Park et al. | | |
| 8,149,635 B2* | 4/2012 | Lee | .......................... | 365/189.16 |

* cited by examiner

*Primary Examiner* — Pho M Luu
(74) *Attorney, Agent, or Firm* — William Park & Associates, Ltd.

(57) ABSTRACT

A semiconductor memory apparatus includes a program pulse generation block configured to generate a first write control signal, second write control signal and a program completion signal in response to a programming enable signal; a set program control circuit configured to repeatedly generate a set programming enable signal a predetermined number of times in response to an erase command and the program completion signal; and a controller configured to disable the first write control signal in response to the erase command and generate the programming enable signal in response to the set programming enable signal.

28 Claims, 13 Drawing Sheets

US 8,817,532 B2

SEMICONDUCTOR MEMORY APPARATUS, AND SET PROGRAM CONTROL CIRCUIT AND PROGRAM METHOD THEREFOR

CROSS-REFERENCES TO RELATED APPLICATION

The present application claims priority under 35 U.S.C. §119(a) to Korean application number 10-2011-0124596, filed on Nov. 25, 2011, in the Korean Intellectual Property Office, which is incorporated herein by reference in its entirety.

BACKGROUND

1. Technical Field

The present invention relates to a semiconductor system, and more particularly, to a semiconductor memory apparatus, and a set program control circuit and a program method therefor.

2. Related Art

A PCRAM (phase change RAM) is a memory apparatus which uses a phase change characteristic of a specified substance constituting a memory cell. A phase change substance may be converted into an amorphous state or a crystalline state depending upon a temperature condition, and may include, for example, a chalcogenide-based alloy. A representative phase change substance includes a Ge2Sb2Te5 (hereafter referred to as a 'GST') substance which comprises germanium, antimony and tellurium.

Most substances have different melting points and crystallization temperatures, and their degree of crystallization may vary depending upon a cooling time and a cooling temperature. This may serve as a unique characteristic of a substance. In particular, a GST substance may be more clearly distinguished between the amorphous state and the crystalline state than other substances.

FIG. 1 is a graph for explaining phase changes of a general phase change substance depending upon a temperature. A GST substance will be used as an example.

When GST is applied with a high temperature equal to or greater than the melting point of GST for a predetermined time (several tens to several hundreds nanoseconds [ns]) and is quenched for a preset time Tq, the amorphous state of the GST is maintained as it is, and a resistance value becomes several hundreds kilohms (kΩ) to several megohms (MΩ).

Also, if the GST is maintained at a crystallization is temperature for a preselected time (several hundreds ns to several microseconds [µs]) and is then cooled, the GST is converted into the crystalline state and the resistance value becomes several kΩ to several tens kΩ. As a time for maintaining the crystallization temperature is lengthened, the crystalline state improves and accordingly, the GST has a smaller resistance value.

FIG. 2 is another graph for explaining phase changes of the general phase change substance depending upon a temperature. Similarly, the GST substance will be used as an example.

FIG. 2 shows an example in which the GST is crystallized by applying a temperature near the melting point of GST for a predetermined time, and slowly cooling the GST. Even in this case, the resistance value of the GST becomes several kΩ to several tens kΩ, and as a cooling time is lengthened, the crystalline state improves. Also, a crystallization time is shortened when compared to FIG. 1.

In order to use such a characteristic of the GST, heat may be directly applied to the GST; or Joule's heat may be electrically generated by current flow through a conductor or a semiconductor to convert the GST between the amorphous state and the crystalline state.

While FIGS. 1 and 2 show general operations of the phase change memory apparatus, the method of FIG. 2 is mainly used since a set data program time, that is, a time required for crystallizing the GST is short.

FIG. 3 is a configuration diagram of a cell array of a is conventional phase change memory apparatus.

Referring to FIG. 3, each memory cell MC is constituted by a phase change substance GST and a switching element which are connected between a word line WL and a bit line BL.

Program operations of a phase change memory apparatus will be described below with reference to FIG. 4.

FIG. 4 is a configuration diagram of a conventional phase change memory apparatus.

Referring to FIG. 4, a phase change memory apparatus 1 includes a program pulse generation block 11, a write driver 12, and a memory block 13.

The program pulse generation block 11 is configured to generate a first write control signal RESETEN and second write control signals SETP<0:n> in response to a programming enable signal PGMP. The program pulse generation block 11 provides the first write control signal RESETEN and the second write control signals SETP<0:n> to the write driver 12. Further, when the operation of generating the first write control signal RESETEN and the second write control signals SETP<0:n> is completed, the program pulse generation block 11 generates a program completion signal PGMNDP and transmits the program completion signal PGMNDP to a controller.

The write driver 12 is configured to be driven in response to a write enable signal WDEN. The write driver 12 is provided with the first write control signal RESETEN and the second write control signals SETP<0:n>, and provides program current I_PGM to the memory block 13 in response to data DATA to be programmed and bit line select switch control signals YSW<0:m>.

Accordingly, in the memory block 13, as the resistant state of a GST is changed depending upon the level of the data DATA to be programmed, the data DATA can be recorded.

FIG. 5 is a block diagram showing an example program pulse generation block shown in FIG. 4.

Referring to FIG. 5, the program pulse generation block 11 is configured to include an initial pulse generation unit 111, a reset pulse generation unit 113, and a quenching pulse generation unit 115.

The initial pulse generation unit 111 is configured to generate a period setting signal QSSETP in response to the programming enable signal PGMP which is provided from the controller. The period setting signal QSSETP is a signal which determines a time to supply heat near a melting point to the GST. The initial pulse generation unit 111 enables the period setting signal QSSETP after counting a preset time in response to the programming enable signal PGMP.

The reset pulse generation unit 113 is configured to generate the first write control signal RESETEN in response to the programming enable signal PGMP and a reset signal IRSTP which is generated by delaying the period setting signal QSSETP by a predefined time.

The quenching pulse generation unit 115 is configured to generate the second write control signals SETP<0:n> which have is different enable periods, in response to the programming enable signal PGMP and the period setting signal QSSETP. Further, the quenching pulse generation unit 115 generates a program completion signal PGMNDP when the generation of the second write control signals SETP<0:n> is completed.

According to such a configuration, the reset pulse generation unit 113 generates the first write control signal RESETEN during a period from after the programming enable signal PGMP is enabled to when the reset signal IRSTP is enabled. The quenching pulse generation unit 115 enables the second write control signals SETP<0:n> at the same levels until the period setting signal QSSETP is enabled, and generates the second write control signals SETP<0:n> after the period setting signal QSSETP is generated.

FIG. 6 is a timing diagram explaining program operations of the conventional phase change memory apparatus.

As a program command PGM is applied, the programming enable signal PGMP is generated from the controller. Accordingly, the initial pulse generation unit 111 operates and generates an internal clock enable signal IPWEN. Then, after an internal clock ICK is generated, counting codes Q<0:3> are generated by counting the preset time, and when the counting is completed, the period setting signal QSSETP is generated.

The reset pulse generation unit 113 enables the first write control signal RESETEN in response to the programming enable signal PGMP, and disables the first write control signal RESETEN as the reset signal IRSTP is enabled. The reset signal IRSTP is generated by delaying the period setting signal QSSETP by the predefined time. During a period in which the first write control signal RESETEN is enabled, programming current is generated from the write driver 12 and is provided to a bit line BL0.

The quenching pulse generation unit 115 generates a count enable signal CKEN (CNTENB) and an internal clock QSCK in response to the period setting signal QSSETP. Accordingly, the second write control signals SETP<0:3> which have different enable periods are generated. When generation of the second write control signal SETP<0:3> is completed, a quenching pulse completion signal QSND is disabled, and then, when a reset signal QSRSTP is enabled, the program completion signal PGMNDP is outputted. In this case, the current driving force of the write driver 12 is sequentially damped according to the enable periods of the second write control signals SETP<0:3>, and a quenching pulse is provided to the GST.

In a program operation, a word line maintains a high potential (equal to or greater than VCC) when a word line select switch is in a disabled state, and is discharged to the level of a ground voltage as the word line select switch is enabled. A current path is formed via a bit line that is selected by the write driver 12. The current path is formed by the write driver 12 through a bit line select switch, the bit line, a switching element and the GST to the word line.

When the current path is formed in this way, the amount of is current driven by the write driver 12 is determined according to the first write control signal RESETEN or the second write control signals SETP<0:n> depending upon a data level (0/1) to be programmed, and the program current is provided to the memory cell through the bit line. For example, when assuming that an amount of current provided by the first write control signal RESETEN is 100%, an amount of current provided to the memory cell when all of the second write control signals SETP<0:3> are enabled is controlled to a rate of 30 to 90%.

In the program operation, the current provided through the bit line is provided in a rectangular type in the case of reset data. In the case of set data, the current is provided initially in a type similar to a rectangular type but is then provided by being reduced into a step type by the second write control signals SETP<0:n>.

Therefore, in the case where set data and reset data are simultaneously programmed, a time required for a program operation is determined by a set data program time that is long when compared to a reset data program time.

Meanwhile, a phase change memory apparatus tends to be used in place of a flash memory. In this case, a memory apparatus performs corresponding operations by receiving a program command and an erase command through a flash memory interface. However, the phase change memory apparatus programs set data or reset data only according to a write command. Therefore, when it is necessary to operate the phase change memory apparatus by the flash memory interface, if an erase command is applied, the phase change memory apparatus does not perform any operation and is in an idle mode.

SUMMARY

In one embodiment of the present invention, a semiconductor memory apparatus includes: a program pulse generation block configured to generate a first write control signal, second write control signal and a program completion signal in response to a programming enable signal; a set program control circuit configured to repeatedly generate a set programming enable signal a predetermined number of times in response to an erase command and the program completion signal; and a controller configured to disable the first write control signal in response to the erase command and generate the programming enable signal in response to the set programming enable signal.

In another embodiment of the present invention, a semiconductor memory apparatus includes: a set program control circuit configured to generate a set programming enable signal in response to an erase command and a program completion signal, and a program pulse generation block configured to output a first write control signal and second write control signal according to a programming enable signal which is generated in response to the set programming enable signal; and a write driver configured to provide a program pulse generated in response to the first write control signal and the second write control signal, to a memory block.

In another embodiment of the present invention, a set program control circuit is connected with a program pulse generation block which generates a program completion signal, in response to a programming enable signal which is generated according to a set programming enable signal, and the set program control circuit generates the set programming enable signal in response to an erase command and the program completion signal.

In another embodiment of the present invention, a program method for a semiconductor memory apparatus includes: inputting set data to a semiconductor memory apparatus having a program pulse generation block; repeatedly generating a programming enable signal a number of times that is determined according to a basic unit of an erase operation and a set data recording unit, by the program pulse generation block; and programming data to a selected region of a memory block by a write driver, in response to the programming enable signal.

BRIEF DESCRIPTION OF THE DRAWINGS

Features, aspects, and embodiments are described in conjunction with the attached drawings, in which.

DETAILED DESCRIPTION

Figure 1:
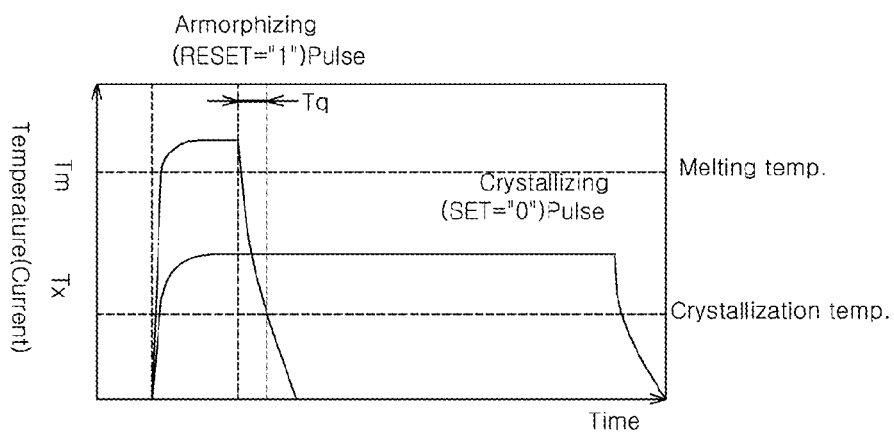
FIG. 1 is a graph for explaining phase changes of a general phase change substance depending upon a temperature.
Figure 2:
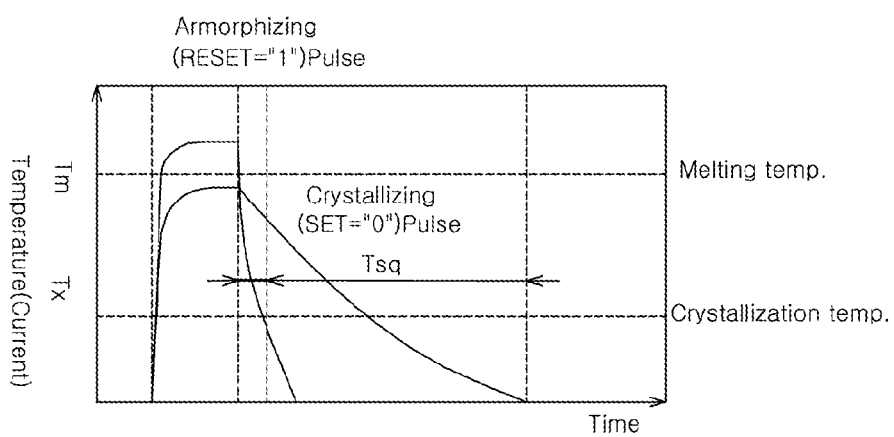
FIG. 2 is another graph for explaining phase changes of the general phase change substance depending upon a temperature.
Figure 3:
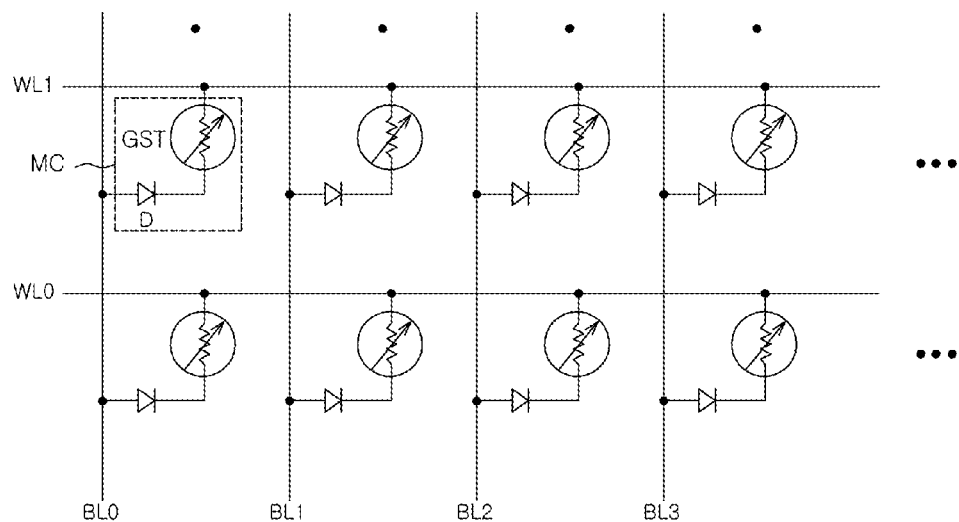
FIG. 3 is a configuration diagram of a cell array of a is conventional phase change memory apparatus.
Figure 4:
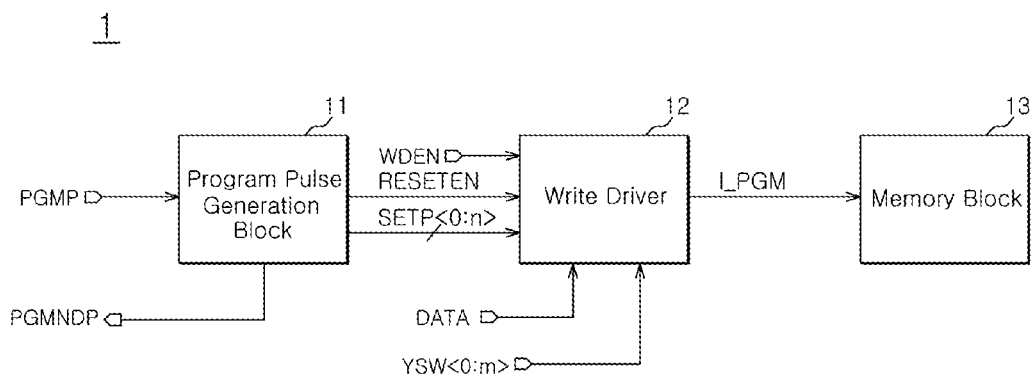
FIG. 4 is a configuration diagram of a conventional phase change memory apparatus.
Figure 5:
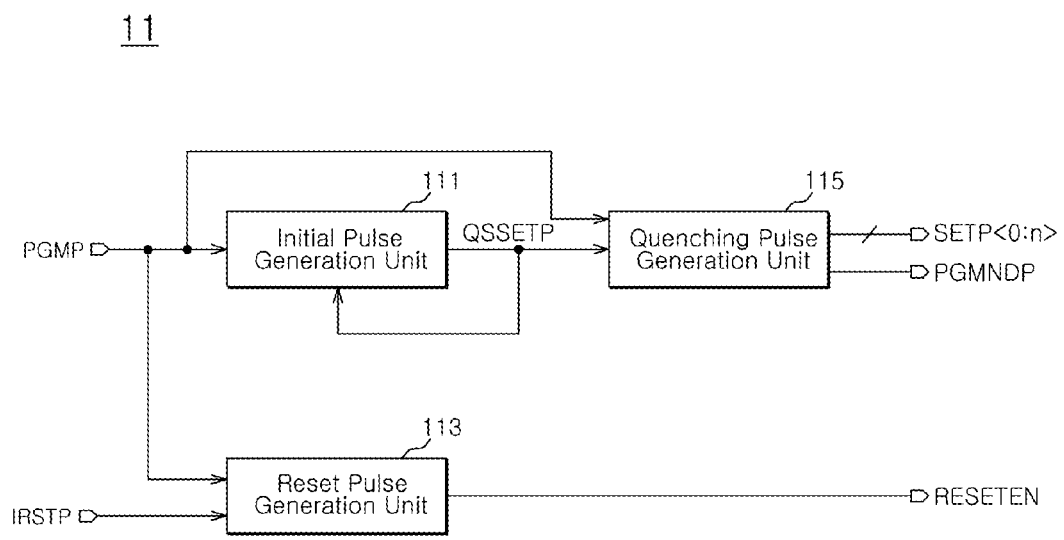
FIG. 5 is a block diagram exemplifying the program pulse generation block shown in FIG. 4.
Figure 6:
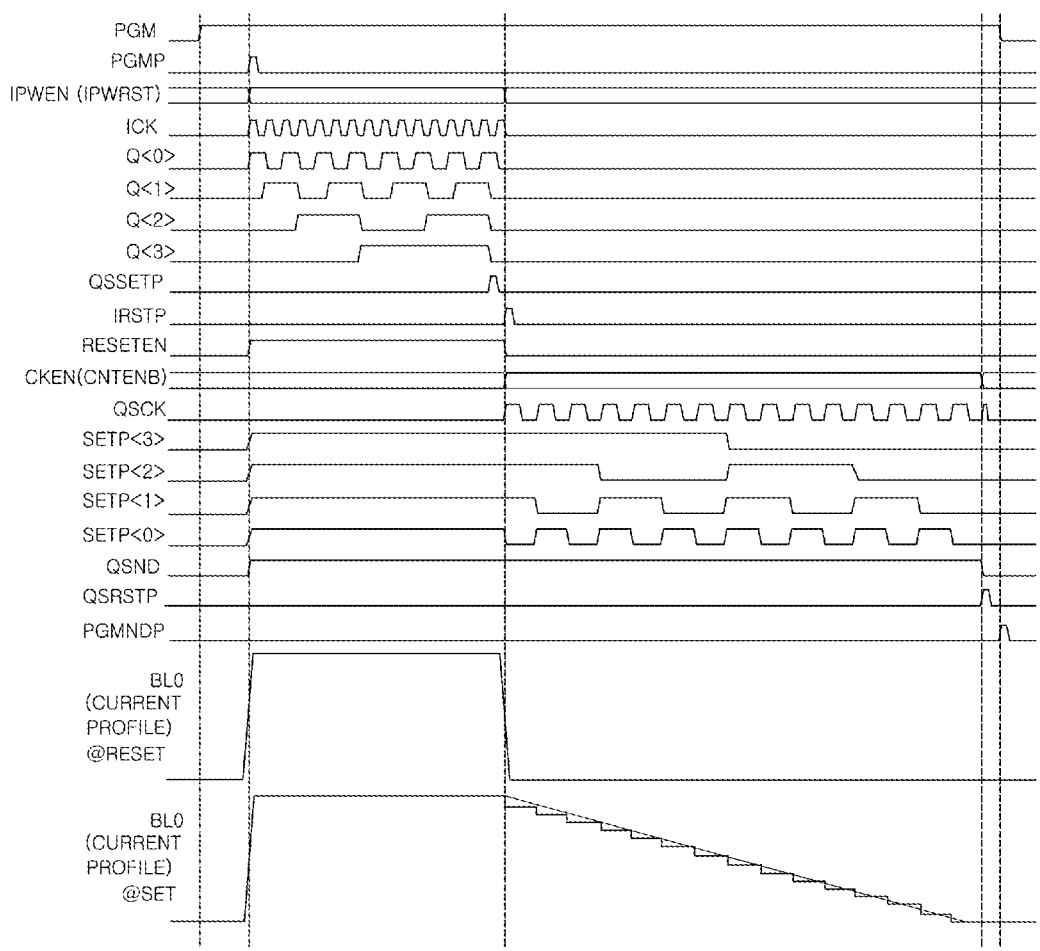
FIG. 6 is a timing diagram explaining program operations of the conventional phase change memory apparatus.

In standards for a semiconductor memory apparatus, in particular, a flash memory apparatus, recording of reset data is defined as a program operation. In particular, a programming operation using units of 16 bits is defined as a single word program, and a programming operation using units of 512 bytes (256 words) is defined as a buffered program. Also, simultaneous recording of reset data and set data is defined as overwrite or an overwrite operation. Further, simultaneous recording of set/reset data by the unit of 16 bits is defined as single word overwrite, and simultaneous recording of set/reset data using units of 512 bytes (256 words) is defined as buffered overwrite.

In an embodiment of the present invention, when a non-volatile memory apparatus (for example, a nonvolatile memory apparatus which is driven in a current driving scheme) is operated by using a flash memory interface, the memory apparatus records set is data in response to an erase command of 128 KB units, and a method of recording the set data to a plurality of nonvolatile memory cells when the erase command is inputted is proposed.

Accordingly, since the non-volatile memory apparatus may be operated even when the erase command is inputted, operation efficiency is improved. Moreover, because a reset data recording time that is relatively shorter than a set data recording time is independent of the set data recording time, a data recording speed may be improved.

To this end, based on the standards for a nonvolatile memory apparatus, specifically, a flash memory apparatus, signals (command codes, addresses, etc.) necessary for a set program operation are temporarily stored in a register, and, as command execution codes are enabled, the set program is performed using the signals stored in the register.

For example, in a phase change memory apparatus, recording of set data is performed using 32 bit units due to a limit in current driving capacity. Since an erase operation is performed in 128 KB units in the standards for a nonvolatile memory apparatus, the set data recording operation is performed 32,768 times in total. Accordingly, by repeatedly performing the erase operation 32,768 times (the number 32,768 for performing the erase operation is arrived at by dividing the basic erase operation unit of 128 KB by the set data recording unit of 32 bits), it is possible to record set data to the plurality of memory cells. In a flash memory interface standard, is a buffered program or buffered overwrite operation is performed using 512 B units. Therefore, the erase operation may be performed 128 KB/512 B times by selecting 128 (512 B/32 bits) word lines. As a result, by repeatedly performing the operation of recording set data in 32 bits memory cells in one erase operation in response to the erase command, it is possible to sequentially record set data to the memory cells.

Hereinafter, a semiconductor memory apparatus, and a set program control circuit and a program method therefor according to the present invention will be described below with reference to the accompanying drawings through example embodiments.

Figure 7:
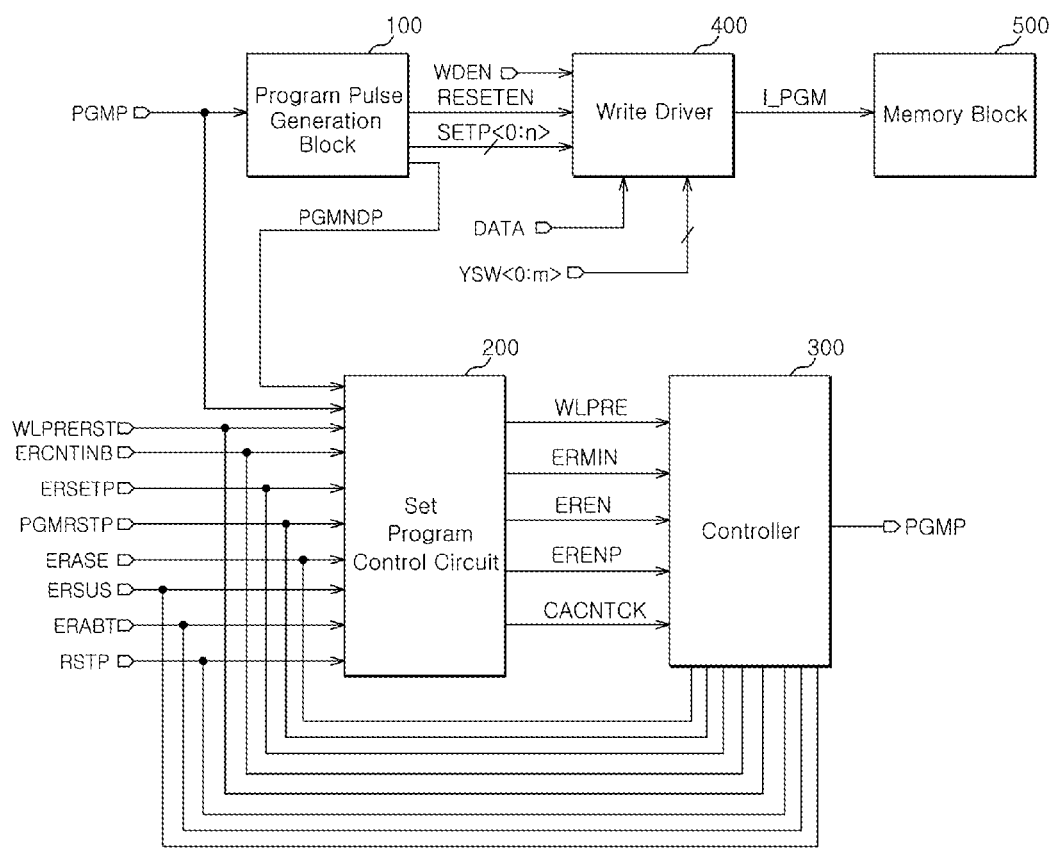
FIG. 7 is a configuration diagram of a semiconductor memory apparatus in accordance with an embodiment of the present invention.

FIG. 7 is a configuration diagram of a semiconductor memory apparatus in accordance with an embodiment of the present invention.

Referring to FIG. 7, a semiconductor memory apparatus 10 includes a program pulse generation block 100 configured to generate a first write control signal RESETEN and second write control signals SETP<0:n> in response to a programming enable signal PGMP; a set program control circuit 200 configured to repeatedly generate a set programming enable signal ERENP a predetermined number of times in response to an erase command ERASE and a program completion signal; a controller 300 configured to provide program operation-related control signals including the programming enable signal PGMP, an address and a data signal; a write driver 400 configured to generate program current I_PGM for programming input data DATA in response to the write control signals RESETEN and SETP<0:n>, and bit line select switch control signals YSW<0:m>; and a memory block 500 including a plurality of memory cells and configured to record data in the respective memory cells according to current provided from the write driver 400.

In the semiconductor memory apparatus 10, the set program control circuit 200 generates the set programming enable signal ERENP which allows an erase operation, that is, a set data recording operation, to be repeatedly performed the predetermined number of times, in response to the erase command ERASE, and provides the set programming enable signal ERENP to the controller 300. The controller 300 provides the programming enable signal PGMP which is generated in response to the set programming enable signal ERENP, to the program pulse generation block 100, so that the erase (set data recording) operation is performed the predetermined number of times.

The set program control circuit 200 provides an address count signal CACNTCK for selecting next word lines after a predetermined number of word lines are selected and the erase operation is performed, and the set program control circuit 200 provides a word line precharge signal WLPRE for precharging the word lines for which the erase operation is currently performed. The set program control circuit 200 may provide the address count signal CACNTCK and the word line precharge signal WLPRE to the controller 300.

Further, the set program control circuit 200 enables an erase period enable signal EREN while the set data recording performed in response to the erase command ERASE is performed, and the set program control circuit 200 generates an erase end signal ERMIN when a final erase operation is started, and the set program control circuit 200 provides the erase end signal ERMIN to the controller 300 to stop the generation of the programming enable signal PGMP.

Operations of the respective component parts of the semiconductor memory apparatus 10 will be described below in detail.

The program pulse generation block 100 generates the first write control signal RESETEN and the second write control signals SETP<0:n> in response to the programming enable signal PGMP generated by the controller 300, and the program pulse generation block 100 provides the first write control signal RESETEN and the second write control signals SETP<0:n> to the write driver 400. Further, when the operation of generating the first write control signal RESETEN and the second write control signals SETP<0:n> is completed, the program pulse generation block 100 generates a program completion signal PGMNDP and transfers the program completion signal PGMNDP to the set program control circuit 200.

In an embodiment of the present invention, since only recording of set data is implemented in the erase operation, the first write control signal RESETEN is controlled to be disabled when the erase command ERASE is enabled by the controller 300. If generation of the second write control signals SETP<0:n> is completed, the program completion signal PGMNDP is enabled and serves as a clock signal (ERCNTCK in FIG. 9) of the set program control circuit 200.

The write driver 400 is driven in response to a write enable signal WDEN. The write driver 400 is provided with the first write control signal RESETEN and the second write control signals SETP<0:n> from the program pulse generation block 100, and the write driver 400 provides the program current I_PGM to the memory block 500 in response to the data DATA to be programmed and the bit line select switch control signals YSW<0:m>.

Accordingly, data may be recorded in the memory block 500 according to the level of the data DATA to be programmed. In an embodiment of the present invention, the memory block 500 may be configured using memory cells in and from which data are recorded and sensed by a current driving scheme. The memory cells in and from which data are recorded and sensed by the current driving scheme include, for example, phase change memory cells, and magnetic memory cells.

The set program control circuit 200 generates the set programming enable signal ERENP on the basis of the basic unit (for example, 128 KB) of an erase operation and the set data recording unit (for example, 32 bits) defined in the standard for a nonvolatile memory apparatus. The set program control circuit 200 generates the set programming enable signal ERENP by using the program completion signal PGMNDP provided from the program pulse generation block 100 as the clock signal (ERCNTCK in FIG. 9). For example, when the set data recording unit is 32 bits, counting is performed 32,768 times for the erase operation, and the set programming enable signal ERENP is enabled each time a counting operation is performed. Also, in order to ensure that the erase operation may be performed by simultaneously selecting the predetermined number of (for example, 128) word lines, the address count signal CACNTCK is generated when the erase operation for selected word lines is completed, such that next word lines to undergo the erase operation may be selected, and the word line precharge signal WLPRE is generated to precharge word lines for which the erase operation is currently performed.

Further, if the erase operation is started in response to the erase command ERASE, the erase period enable signal EREN is generated to notify that the erase operation is being performed, and if final counting is performed, that is, if a final erase operation is performed, the erase end signal ERMIN is generated so that generation of the programming enable signal PGMP is stopped.

Although the set program control circuit 200 is shown independently of the program pulse generation block 100 in FIG. 7, the set program control circuit 200 may be configured to be included in the program pulse generation block 100. That is to say, the program pulse generation block 100 may include the set program control circuit 200.

Figure 8:
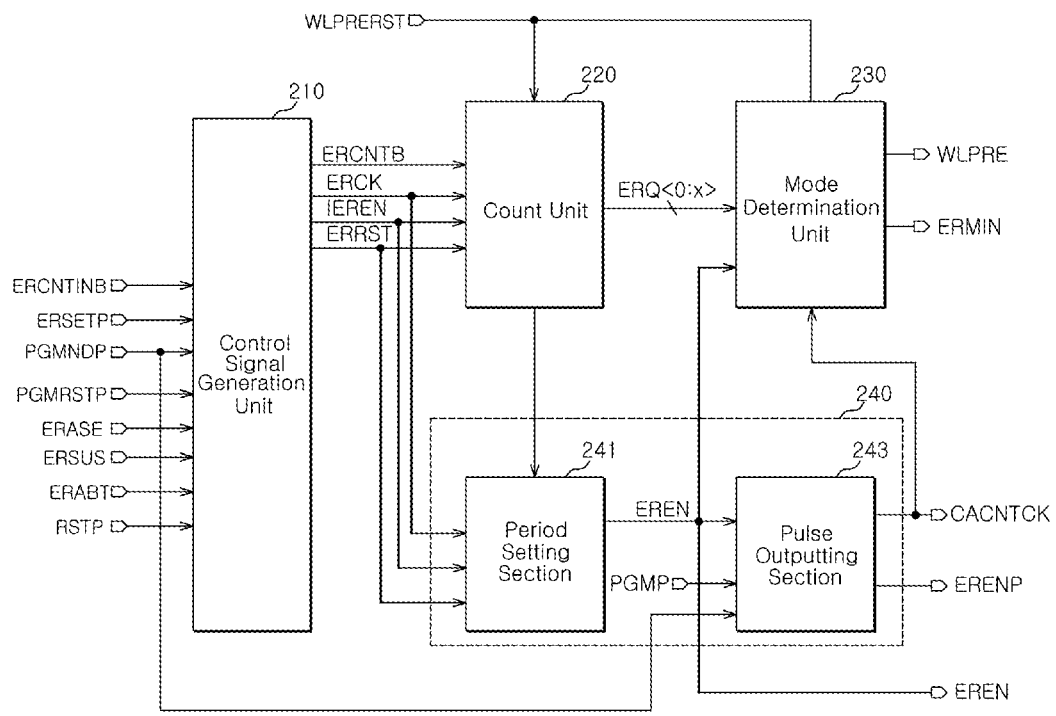
FIG. 8 is a configuration diagram of a set program control circuit in accordance with the embodiment of the present invention.

FIG. 8 is a configuration diagram of a set program control circuit in accordance with the embodiment of the present invention.

Referring to FIG. 8, the set program control circuit 200 may be configured to include a control signal generation unit 210, a count unit 220, a mode determination unit 230, and a set program pulse generation unit 240.

The control signal generation unit 210 is configured to generate a number of erase times count signal ERCNTB in response to a count enable signal ERCNTINB and the erase command ERASE which are provided from the controller 300. Also, the control signal generation unit 210 is configured to generate an erase clock signal ERCK in response to the clock signal ERCNTCK generated from the program completion signal PGMNDP and the erase command ERASE. In addition, the control signal generation unit 210 is configured to generate an erase reset signal ERRST by combining situations which may occur in various cases where the operation of the count unit 220 should be reset. Signals involved in generation of the erase reset signal ERRST include, but are not limited to, a suspend signal ERSUS, a program reset signal PGMRSTP, an error signal ERABT and a reset signal RSTP. Further, the control signal generation unit 210 is configured to generate an erase enable signal IEREN in response to an erase mode set signal ERSETP provided from the controller 300.

The number of erase times count signal ERCNTB, the erase clock signal ERCK, the erase reset signal ERRST and the erase enable signal IEREN are respectively enabled when the suspend signal ERSUS is not generated. The suspend signal ERSUS is enabled when it is necessary to interrupt the erase operation for a little while and perform another operation while the erase command ERASE is inputted and the erase operation is internally performed. The operation to be performed when the erase operation is interrupted includes a data read operation, a status read operation, or a row data buffer write operation.

Figure 9:
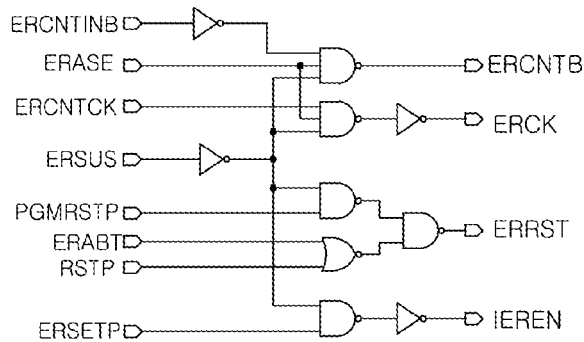
FIG. 9 is a view exemplifying the control signal generation unit shown in FIG. 8.

FIG. 9 is a view exemplifying the control signal generation unit shown in FIG. 8.

It can be seen that, if the count enable signal ERCNTINB is enabled to a low level and the clock signal ERCNTCK and the erase command ERASE are inputted, the number of erase times count signal ERCNTB and the erase clock signal ERCK are transferred to the count unit 220 only when the suspend signal ERSUS is in a disabled state. The erase reset signal ERRST is enabled even when only one among the suspend signal ERSUS, the program reset signal PGMRSTP, the error signal ERABT and the reset signal RSTP is enabled. Further, the erase enable signal IEREN is enabled when the erase mode set signal ERSETP is enabled and the suspend signal ERSUS is in the disabled state.

Referring back to FIG. 8, the count unit 220 is configured to perform a counting operation in response to the number of erase times count signal ERCNTB, the erase clock signal ERCK, the erase reset signal ERRST and the erase enable signal IEREN which are provided from the control signal generation unit 210 and a precharge reset signal WLPRERST which is provided from the controller 300.

First, the count unit 220 is in an operable state as the number of erase times count signal ERCNTB is enabled, and the initial value of count unit 220 is set by the erase enable signal IEREN. The count unit 220 performs the counting operation in response to the erase clock signal ERCK and as a result, outputs counting signals ERQ<0:x>.

In an embodiment of the present invention, when an erase mode is performed in 128 KB units and set data is recorded in 32 bit memory cells in one erase operation, counting operations of 32,768 iterations are performed, and in this case, the counting signals ERQ<0:x> should be able to count 15 bits.

To this end, without a limiting sense, the count unit 220 may be configured using 15 down counters, the initial values of all the down counters are set to 1, and counting is performed until the outputs of all the down counters become 0. The erase clock signal ERCK which is provided to the count unit 220 is generated from the program completion signal PGMNDP as previously mentioned. Accordingly, each time the count unit 220 performs the counting operation, the set program pulse generation unit 240 generates the set programming enable signal ERENP, by which the set data is recorded. After the set data is recorded, the program completion signal PGMNDP is enabled. This process is repeated until operation of the count unit 220 is completed. Completion of the operation of the count unit 220 may be confirmed by a period setting section 241 of the set program pulse generation unit 240.

The set program pulse generation unit 240 outputs the set programming enable signal ERENP depending upon whether it is a set program period responsive to the erase command ERASE. For example, in an initial stage of a set program operation, that is, in a first set program operation, the programming enable signal PGMP is passed through the pulse outputting section 243 as it is (without modification), and if the program completion signal PGMNDP is generated according to the first set program operation, the program completion signal PGMNDP is outputted as the set programming enable signal ERENP.

To this end, the set program pulse generation unit 240 may be configured to include the period setting section 241 and a pulse outputting section 243.

The period setting section 241 may be configured, for example, using the same counter as a counter which constitutes the count unit 220. The period setting section 241 generates the erase period enable signal EREN. The erase period enable signal EREN is enabled when the erase mode set signal ERSETP is enabled. The erase mode set signal ERSETP may signify the start of the erase operation. When the count unit 220 completes the final counting operation, the erase period enable signal EREN is disabled by the erase clock signal ERCK and is provided to the controller 300.

Figure 11:
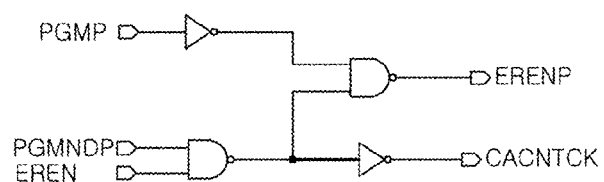
FIG. 11 is a view exemplifying a pulse outputting section shown in FIG. 8.

The pulse outputting section 243 may be configured, for example, as shown in FIG. 11.

FIG. 11 is a view exemplifying the pulse outputting section shown in FIG. 8.

The pulse outputting section 243 is configured to output the programming enable signal PGMP or the program completion signal PGMNDP as the set programming enable signal ERENP according to whether or not the erase period enable signal EREN is enabled.

In other words, the pulse outputting section 243 passes through the programming enable signal PGMP without modification as the set programming enable signal ERENP when the erase period enable signal EREN is disabled. Conversely, the pulse outputting section 243 outputs the program completion signal PGMNDP as the set programming enable signal ERENP when the erase period enable signal EREN is enabled.

Namely, if the program completion signal PGMNDP is enabled while the erase period enable signal EREN is enabled, the program completion signal PGMNDP is outputted as the set programming enable signal ERENP. When the erase period enable signal EREN is in the disabled state, that is, in the first erase operation, the programming enable signal PGMP is passed through as the set programming enable signal ERENP.

Further, the pulse outputting section 243 generates the address count signal CACNTCK depending upon the levels of the erase period enable signal EREN and the program completion signal PGMNDP. The address count signal CACNTCK is a signal for operating a column address counter that is provided to the mode determination unit 230. If the address count signal CACNTCK is enabled, the word lines which are currently performing an erase operation are precharged, and next word lines to perform an erase operation are selected.

The mode determination unit 230 is configured to generate the word line precharge signal WLPRE and the erase end signal ERMIN in response to the counting signals ERQ<0:x> provided from the count unit 220 and the erase period enable signal EREN provided from the set program pulse generation unit 240.

Figure 10:
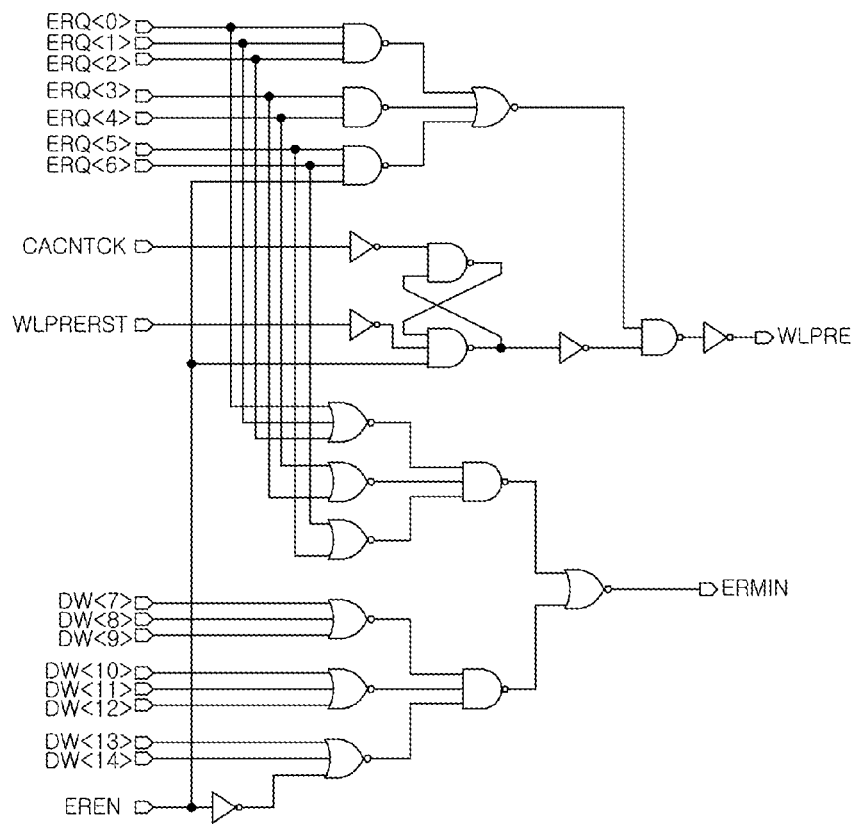
FIG. 10 is a view exemplifying a mode determination unit shown in FIG. 8.

FIG. 10 is a view exemplifying the mode determination unit shown in FIG. 8.

When the erase operation for the memory cells connected to the predetermined number of word lines is completed, the mode determination unit 230 generates the word line precharge signal WLPRE for precharging the word lines for which the erase operation is currently completed, for another erase operation for the memory cells connected to the next word lines.

For example, when the erase operation is performed by selecting 128 (512 B/32 bits) word lines in the erase mode for recording the set data in the memory cells of 128 KB, the word line precharge signal WLPRE may be enabled each time the count unit 220 down-counts by 128 from an initial value (32,768). In the case where counting of 32,768 times is necessary, the count unit 220 may be configured using 15 down counters. Therefore, when some counting signals ERQ<0:6> among the counting signals ERQ<0:14> all transition from a low level to a high level, the word line precharge signal WLPRE may be enabled.

When the word line precharge signal WLPRE is enabled, the word lines selected for the current erase operation are disabled, and the next word lines to perform an erase operation may be enabled after a time for precharge elapses.

When the next word lines to perform an erase operation enabled, the count unit 220 operates and the set programming enable signal ERENP is generated, and accordingly, the address count signal CACNTCK is enabled and next word line(s) to perform an erase operation are selected. This process is repeated.

The word line precharge signal WLPRE may be configured to be enabled by the address count signal CACNTCK and be disabled by the precharge reset signal WLPRERST.

If the count unit 220 performs the final counting operation, all the counting signals ERQ<0:14> become the low level, and the erase end signal ERMIN is generated by combining the counting signals ERQ<0:14>.

The erase end signal ERMIN is a signal signifying that it is a period in which the final erase operation is performed. After the erase end signal ERMIN is enabled, the controller 300 prevents the programming enable signal PGMP from being enabled.

In this way, in an embodiment of the present invention, when it is necessary to repeatedly perform the unit erase operation by the predetermined set data recording unit, the set programming enable signal ERENP is generated a number of iterations, where the number of iterations is obtained by dividing the unit erase operation by the set data recording unit, and the set programming enable signal ERENP is provided as the programming enable signal PGMP. If the programming enable signal PGMP is enabled, the second write control signals SETP<0:n> are generated, and the program current I_PGM determined by the second write control signals SETP<0:n> is provided to the memory cells. At this time, the first write control signal RESETEN is in the disabled state as a matter of course.

When the set programming enable signal ERENP is generated, the address count signal CACNTCK is also generated so that the word lines to be erased may be activated and the currently erase-completed word lines may be precharged.

Such a set data recording operation through the erase mode is repeatedly performed while the erase period enable signal EREN is enabled. The erase period enable signal EREN is disabled by the erase clock signal ERCK as the count unit 220 completes the final counting operation after the erase mode set signal ERSETP is enabled.

Figure 12:
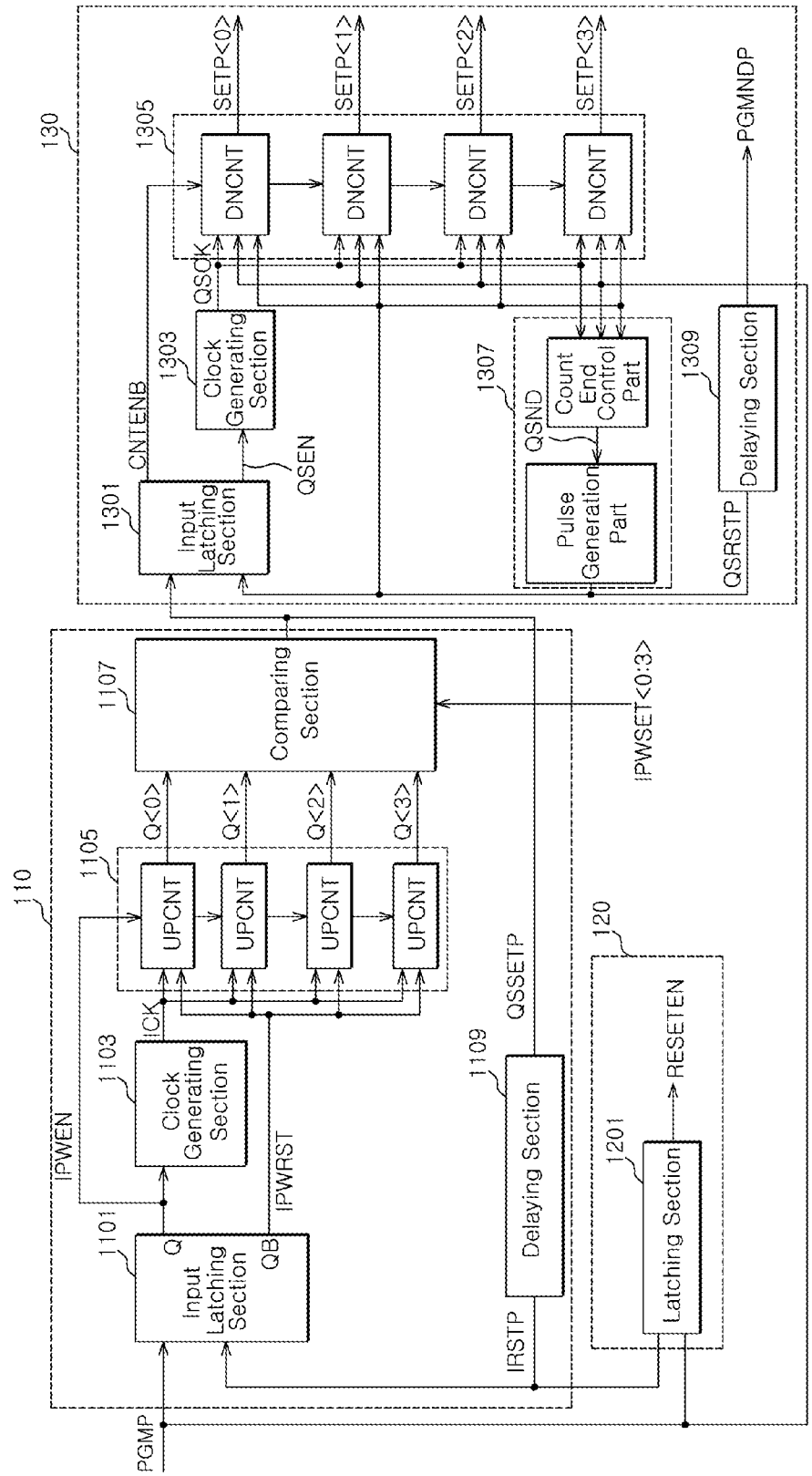
FIG. 12 is a view exemplifying a program pulse generation block which may be applied to an embodiment of the present to invention.

FIG. 12 is a view exemplifying a program pulse generation block which may be applied to the present invention.

Referring to FIG. 12, the program pulse generation block 100 includes an initial pulse generation unit 110, a reset pulse generation unit 120, and a quenching pulse generation unit 130.

The initial pulse generation unit 110 is configured to generate the period setting signal QSSETP in response to the programming enable signal PGMP which is provided from the controller 300. The period setting signal QSSETP is a signal for determining a time for providing heat near a melting point to a GST. The initial pulse generation unit 110 enables the period setting signal QSSETP after counting a predetermined time interval in response to the programming enable signal PGMP.

The reset pulse generation unit 120 is configured to generate the first write control signal RESETEN in response to the programming enable signal PGMP and the reset signal IRSTP which is generated by delaying the period setting signal QSSETP by a predefined time interval.

The quenching pulse generation unit 130 is configured to generate the second write control signals SETP<0:n> which have different enable periods, in response to the programming enable signal PGMP and the period setting signal QSSETP. When the generation of the second write control signals SETP<0:n> is completed, the quenching pulse generation unit 130 generates the program completion signal PGMNDP.

According to the configuration as described above, the reset pulse generation unit 120 generates the first write control signal RESETEN during a period from after the programming enable signal PGMP is enabled to until the reset signal IRSTP is enabled. The quenching pulse generation unit 130 enables the second write control signals SETP<0:n> at the same levels from after the programming enable signal PGMP is enabled to until the period setting signal QSSETP is enabled, and generates the second write control signals SETP<0:n> which are controlled in the enable periods thereof, after the period setting signal QSSETP is generated.

Detailed descriptions will be given below.

First, the initial pulse generation unit 110 includes an input latching section 1101, a clock generating section 1103, a first counting section 1105, a comparing section 1107, and a delaying section 1109.

The input latching section 1101 is configured to output the internal clock enable signal IPWEN and a count reset signal IPWRST in response to the programming enable signal PGMP and the reset signal IRSTP. That is to say, if the programming enable signal PGMP is enabled, for example, to a high level, the internal clock enable signal IPWEN is activated to a high level, and if the reset signal IRSTP is enabled to a high level, the count reset signal IPWRST is activated to a high level.

In detail, the input latching section 1101 may be configured such that the internal clock enable signal IPWEN is enabled to the high level and the count reset signal IPWRST is enabled to a low level. The input latching section 1101 may be configured using an R-S latch constituted by a NAND gate or a NOR gate, or a flip-flop.

The clock generating section 1103 is configured to generate an internal clock ICK in response to the internal clock enable signal IPWEN. In other words, the clock generating section 1103 outputs the internal clock ICK which toggles while the internal clock enable signal IPWEN is activated to the high level.

The first counting section 1105 is configured to output counting codes Q<0:3> which are counted according to control of the internal clock enable signal IPWEN, the count reset signal IPWRST and the internal clock ICK. Namely, the first counting section 1105 performs a counting operation according to control of the internal clock ICK when the internal clock enable signal IPWEN is activated to the high level. If the count reset signal IPWRST is activated to the high level, the counting codes Q<0:3> outputted from the first counting section 1105 are initialized. In this way, as the counting codes Q<0:3> are generated using the first counting section 1105, a circuit size may be significantly reduced. The first counting section 1105 may be configured by up counters.

The comparing section 1107 is configured to activate and output the period setting signal QSSETP when the counting codes Q<0:3> reach a preset value. In detail, the comparing section 1107 is configured to compare the counting codes Q<0:3> with time control codes IPWSET<0:3> applied, and the comparing section 1107 is configured to activate the period setting signal QSSETP when the counting codes Q<0:3> are the same as the time control codes IPWSET<0:3>. That is to say, the activation timing of the period setting signal QSSETP may be controlled by controlling the time control codes IPWSET<0:3>.

In an embodiment of the present invention, the generation timing of the period setting signal QSSETP may be delayed by simultaneously increasing the number of counters constituting the first counting section 1105 and the number of time control codes IPWSET. This means that a time required for melting the GST constituting a memory cell may be changed.

The delaying section 1109 is configured to delay the period setting signal QSSETP by the predetermined time interval and output the reset signal IRSTP. The delay value of the delaying section 1109 is set to satisfy a prescribed timing margin. The reset signal IRSTP generated by the delaying section 1109 resets the input latching section 1101 and disables the internal clock enable signal IPWEN, and enables the count reset signal IPWRST such that the clock generating section 1103 and the first counting section 1105 are disabled.

The reset pulse generation unit 120 is enabled by the programming enable signal PGMP and is disabled by the period setting signal QSSETP. In other words, the reset pulse generation unit 120 generates the first write control signal RESETEN for the time set by the time control codes IPWSET<0:3>, and provides the first write control signal RESETEN to the write driver 400.

Next, the quenching pulse generation unit 130 may be configured to include an input latching section 1301, a clock generating section 1303, a second counting section 1305, a reset controlling section 1307, and a delaying section 1309.

The input latching section 1301 is configured to output the count enable signal CNTENB and the internal clock enable signal QSEN in response to the period setting signal QSSETP and the reset signal QSRSTP. The clock generating section 1303 is configured to generate an internal clock QSCK in response to an internal clock enable signal QSEN. Namely, the clock generating section 1303 outputs the internal clock QSCK which toggles while the internal clock enable signal QSEN is activated to a high level.

The second counting section 1305 is configured to output the second write control signals SETP<0:3> in response to a count enable signal CNTENB, the internal clock QSCK, the programming enable signal PGMP and a reset signal QSRSTP. Accordingly, the update cycle of the second write control signals SETP<0:3> is controlled in correspondence to the toggling cycle of the internal clock QSCK.

In an embodiment of the present invention, the second counting section 1305 may be configured to include down counters. In this case, the second counting section 1305 operates while a final output is changed from 0x1111b to 0x0000b. If the final output becomes 0x0000b, the output signal of the second write control signal SETP<3> drives the reset controlling section 1307.

The reset controlling section 1307 is configured to enable the reset signal QSRSTP when the code value of the second write control signals SETP<0:3> outputted from the second counting section 1305 reaches a predetermined value, that is, when the output signal of the second write control signal SETP<3> transitions from a high level to a low level.

To this end, the reset controlling section 1307 may include a count end control part and a pulse generation part. The count end control part generates a quenching pulse completion signal QSND as counting of the second counting section 1305 is completed, and the pulse generation part generates the reset signal QSRSTP in response to the quenching pulse completion signal QSND. For example, the quenching pulse completion signal QSND outputted from the count end control part maintains a high level by the programming enable signal PGMP, and transitions to a low level when the second write control signals SETP<3> becomes the low level. The pulse generation part enables the reset signal QSRSTP by the quenching pulse completion signal QSND transitioned to the low level.

The delaying section 1309 is configured to delay the reset signal QSRSTP by a preselected time and generates the program completion signal PGMNDP. The program completion signal PGMNDP is transmitted to the controller 300 and notifies that the program is completed.

Figure 13:
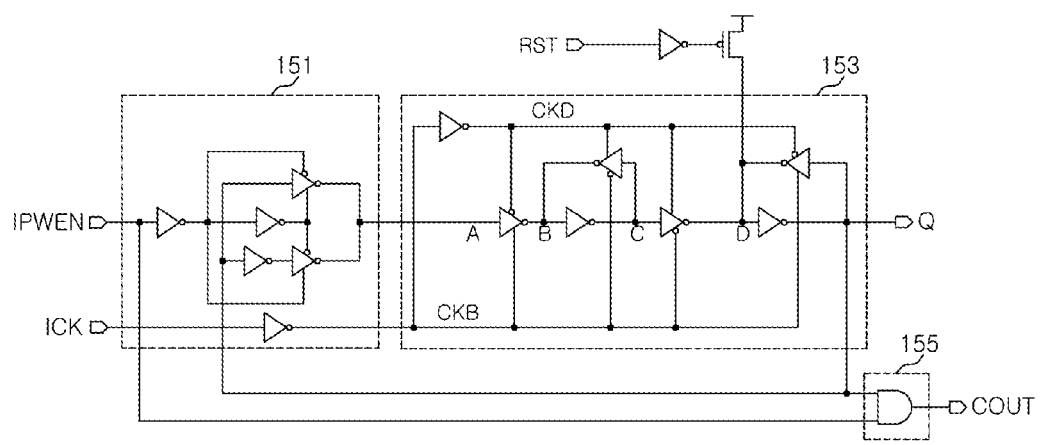
FIG. 13 is an exemplary view explaining a configuration of a first counting section shown in FIG. 12.

FIG. 13 is an exemplary view illustrating a configuration of the first counting section shown in FIG. 12.

In an embodiment of the present invention, the first counting section 1105 may be configured using a plurality of 1-bit up counters, and FIG. 13 shows an example of an up counter.

Referring to FIG. 13, a 1-bit up counter 150 may include a signal input part 151, a latch part 153, and a carry generation part 155.

The signal input part 151 is configured to determine the level of the signal of an input node A of the latch part 153 in response to a count enable signal, that is, the internal clock enable signal IPWEN and the first counting code Q<0> in an embodiment of the present invention.

The latch part 153 is configured to latch the signal outputted from the signal input part 151 according to the control of the internal clock ICK and output the first counting code Q<0>. The carry generation part 155 is configured to output a carry signal COUT according to the internal clock enable signal IPWEN and the first counting code Q<0>. The carry signal COUT is used as a count enable signal of a next stage 1-bit up counter. The internal node of the latch part 153 is initialized or is changed to a specified level in response to the count reset signal IPWRST.

In detail, the signal input part 151 selects the resultant value of an output node Q when the internal clock enable signal IPWEN is disabled to a low level, and oppositely selects the resultant value of the output node Q and transfers the oppositely selected resultant value to the next stage 1-bit up counter when the internal clock enable signal IPWEN is enabled to the high level.

The latch part 153 transfers the signal of the node A to a node C when the signal of the node A is a low level, and transfers the signal of the node A to the output node Q when the signal of the node A is a high level.

If the count reset signal RST becomes the high level, the output node Q is reset to a low level, and the carry generation part 155 operates according to the signal applied to the output node Q of a previous stage 1-bit up counter, which serves as a count enable signal. That is to say, according to the signal level of the signal applied to the output node Q of a previous stage 1-bit up counter, a next stage 1-bit up counter toggles.

Figure 14:
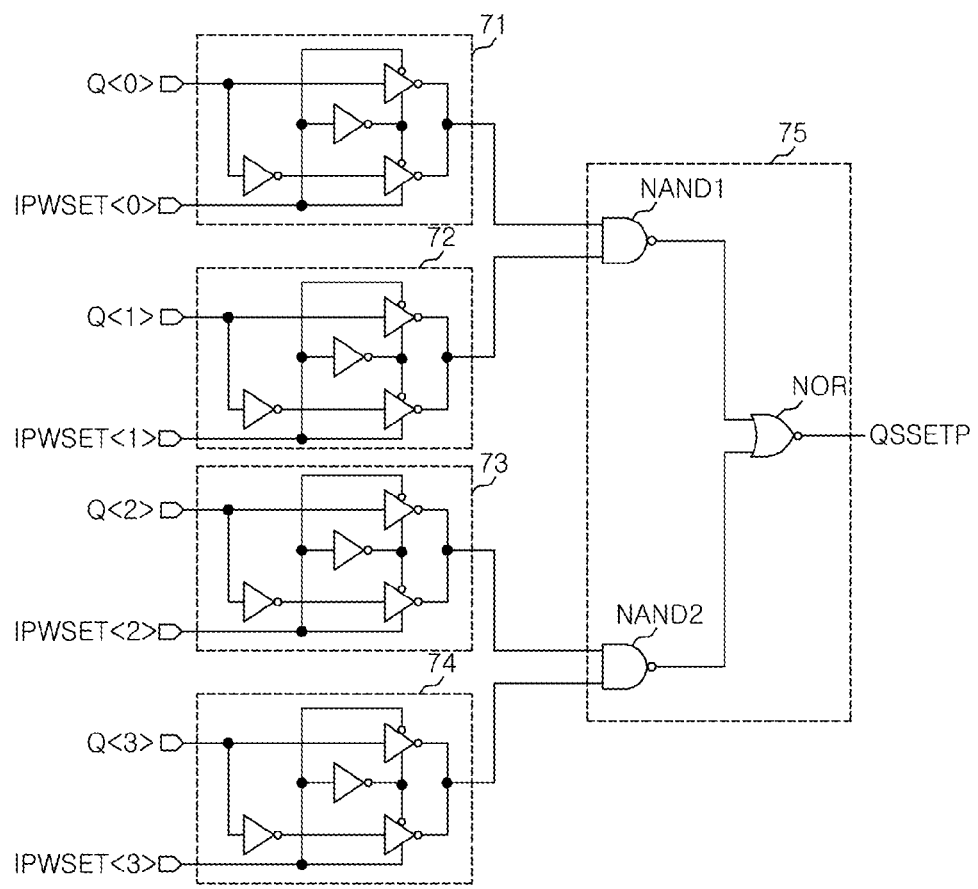
FIG. 14 is a view exemplifying a comparing section shown in FIG. 12.

FIG. 14 is a view exemplifying the comparing section shown in FIG. 12.

Referring to FIG. 14, the comparing section 1107 may include a plurality of comparison parts 71, 72, 73 and 74 and a signal combination part 75. The plurality of comparison parts 71, 72, 73 and 74 are configured to compare respective bit values of the counting codes Q<0:3> and the time control codes IPWSET<0:3> and output a plurality of comparison result signals. The signal combination part 75 is configured to combine the plurality of comparison result signals outputted from the plurality of comparison parts 71, 72, 73 and 74, and output the period setting signal QSSETP. In other words, in an embodiment, the comparing section 1107 activates and outputs the period setting signal QSSETP when the counting codes Q<0:3> and the time control codes IPWSET<0:3> are the same with each other.

Figure 15:
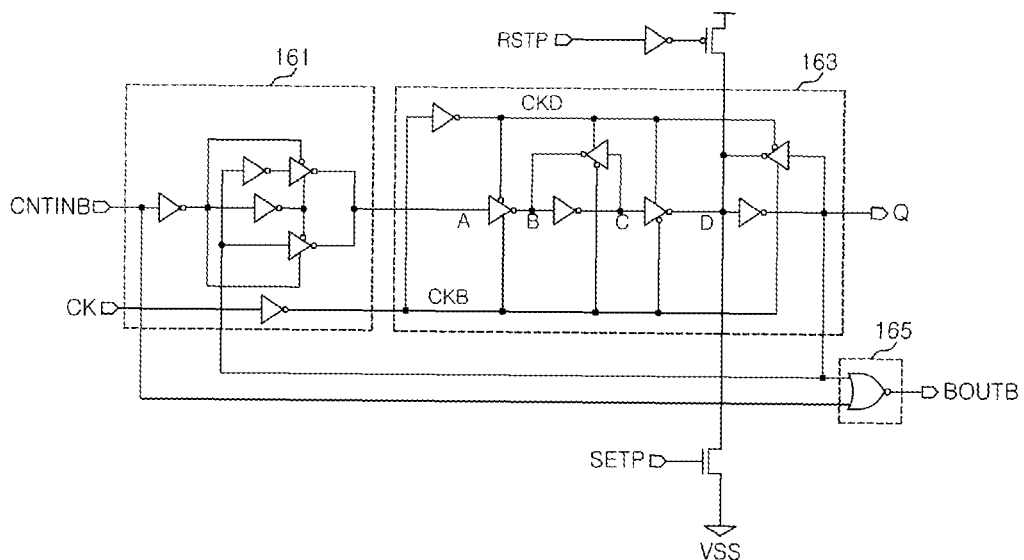
FIG. 15 is a view for explaining configurations of a period setting section shown in FIG. 8 and a second counting section shown in FIG. 12.

FIG. 15 is a view for explaining configurations of the period setting section shown in FIG. 8 and the second counting section shown in FIG. 12.

In an embodiment of the present invention, the period setting section 241 shown in FIG. 8 may be configured using a down counter, for example, a 1-bit down counter.

Referring to FIG. 15, the 1-bit down counter 160 may include a signal input part 161, a latch part 163, and a borrow generation part 165.

The signal input part 161 is configured to determine the level of the signal of an input node A of the latch part 163 according to a count enable signal CNTINB and the level of the data applied to an output node Q.

The latch part 163 is configured to latch the signal outputted from the signal input part 161 according to the control of the clock signal CK, and transfer the latched data to the output node Q.

The borrow generation part 165 is configured to output a borrow signal BOUTB according to the count enable signal CNTINB and the level of the signal applied to the output node Q.

The internal node of the latch part 163 is initialized or is changed to a specified level in response to the reset signal RSTP and a set signal SETP.

In detail, the signal input part 161 selects the resultant value of the output node Q when the count enable signal CNTINB is disabled to a high level, and oppositely selects the resultant value of the output node Q and transfers the oppositely selected resultant value to a next stage when the count enable signal CNTINB is enabled to a low level.

The signal selected by the signal input part 161 is applied to the node A. Accordingly, the latch part 163 transfers the signal of the node A to a node C when the signal of the node A is a low level, and transfers the signal of the node A to the output node Q when the signal of the node A is a high level.

If the set signal SETP becomes a high level, the output node Q is set to a high level. If the reset signal RSTP becomes a high level, the output node Q is reset to a low level.

The borrow generation part 165 outputs the borrow signal BOUTB of a low level when the output node Q of a previous stage counter becomes a low level.

Figure 16:
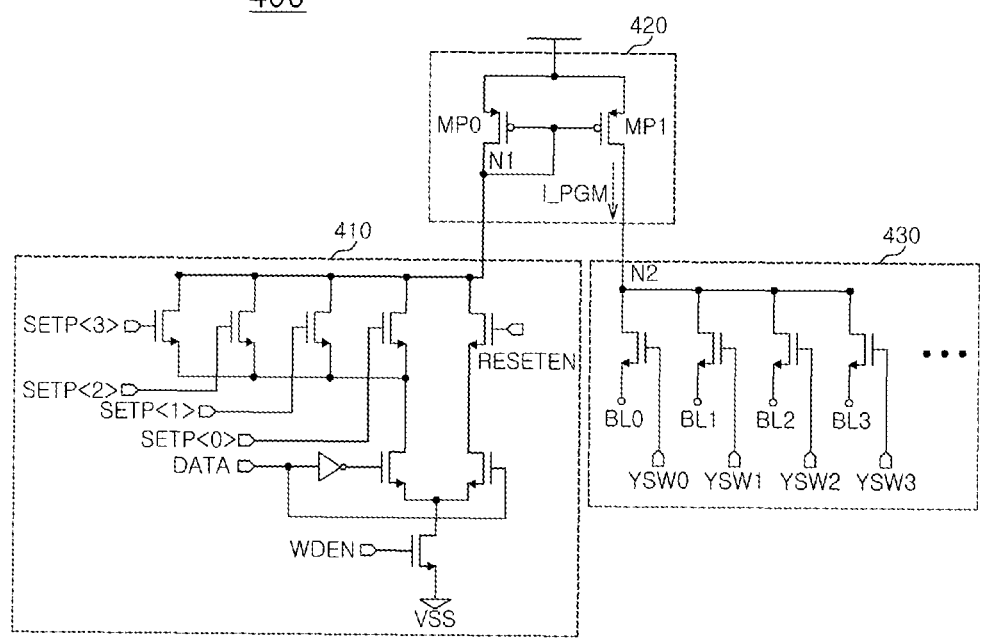
FIG. 16 is a view exemplifying a write driver which may be applied to an embodiment of the present invention.

FIG. 16 is a view exemplifying a write driver which may be applied to the present invention.

Referring to FIG. 16, the write driver 400 may include a current controlling section 410, a current driving section 420, and a selecting section 430.

The current controlling section 410 is configured to receive the data DATA to be programmed, and control the voltage level of a control node N1 according to a code combination of the first write control signal RESETEN and the second write control signals SETP<0:3> when the write enable signal WDEN is activated. A plurality of NMOS transistors, which are controlled by the second write control signals SETP<0: 3>, are selectively turned on and control the voltage level of the control node N1. An NMOS transistor, which is controlled by the first write control signal RESETEN, is turned on when the first write control signal RESETEN is activated and controls the voltage level of the control node N1.

The second write control signals SETP<0:3> are signals which are cyclically updated, and the first write control signal RESETEN is a signal which is inputted in the form of a pulse.

The current driving section 420 is configured to drive the programming current pulse I_PGM which has a magnitude corresponding to the voltage level of the control node N1. The current driving section 420 may drive the current pulse I_PGM to an output node N2. The programming current pulse I_PGM may be divided into a first programming current pulse which corresponds to the first write control signal RESETEN and a second programming current pulse which corresponds to the second write control signals SETP<0:3>.

The selecting section 430 is configured to output the programming current pulse I_PGM driven by the current driving section 420 to bit lines BL0 to BLm corresponding to the plurality of bit line select switch control signals YSW<0:m>.

Figure 17:
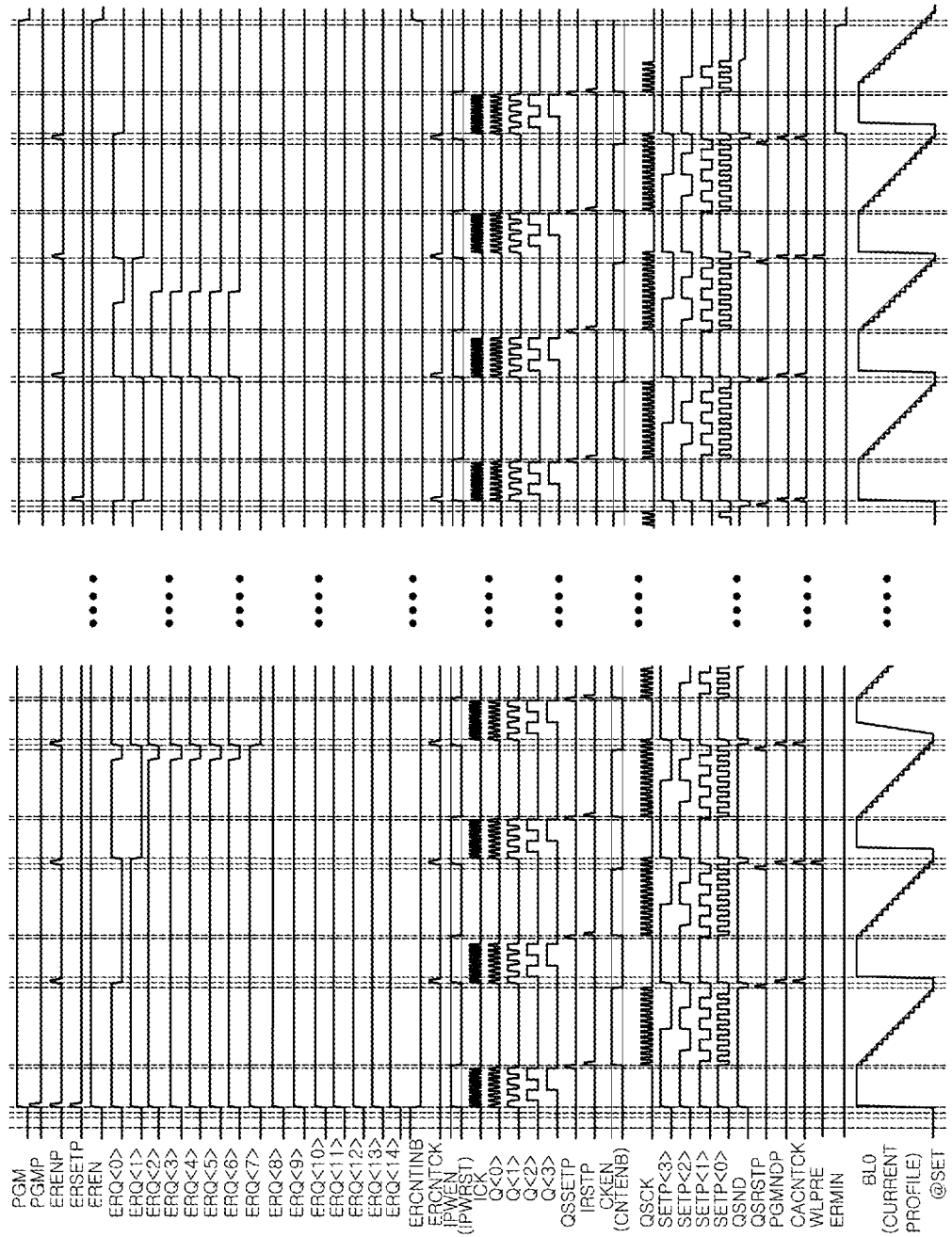
FIG. 17 is a timing diagram explaining set program operations in accordance with an embodiment of the present invention.

FIG. 17 is a timing diagram explaining set program operations in accordance with an embodiment of the present invention, and will be described with reference back to FIG. 8.

Before the set program operation is started in response to the erase command ERASE, signals (command codes, addresses, etc.) necessary for the set program operation are temporarily stored in registers.

Thereafter, as the program command PGM is applied, the programming enable signal PGMP is generated from the controller 300, and the set program pulse generation unit 240 transfers the programming enable signal PGMP as the set programming enable signal ERENP without modifying the programming enable signal PGMP. The period setting section 241 of the set program pulse generation unit 240 enables the erase period enable signal EREN in response to the erase mode set signal ERSETP provided from the controller 300.

The count unit 220 performs counting in response to the number of erase times count signal ERCNTB, the erase clock signal ERCK (generated in response to the clock signal ERCNTCK generated from the program completion signal PGMNDP and the erase command ERASE), and the erase enable signal IEREN. The count unit 220 generates the counting signals ERQ<0:14> as a result of the counting, and provides the counting signals ERQ<0:14> to the mode determination unit 230.

With the first write control signal RESETEN disabled, the program current I_PGM is applied to the memory cells by the second write control signals SETP<0:n> (which are generated by the programming enable signal PGMP enabled each time the set programming enable signal ERENP is enabled), and the set data is recorded.

That is to say, the internal clock enable signal IPWEN is generated from the initial pulse generation unit 110 of the program pulse generation block 100. After the internal clock ICK is generated from the internal clock enable signal IPWEN, the counting codes Q<0:3> are generated by counting the predetermined time, and the period setting signal QSSETP is generated when the counting is completed.

The reset pulse generation unit 120 is disabled, and the quenching pulse generation unit 130 generates the count enable signal CKEN (CNTENB) and the internal clock QSCK in response to the period setting signal QSSETP. Further, according to this fact, the quenching pulse generation unit 130 generates the second write control signals SETP<0: 3> which have different enable periods. When generation of the second write control signals SETP<0:3> is completed, the quenching pulse completion signal QSND is disabled, and, as the reset signal QSRSTP is enabled accordingly, the program completion signal PGMNDP is outputted. In this case, as the current driving force of the write driver 400 is sequentially damped according to the enable periods of the second write control signals SETP<0:3>, a quenching pulse is provided to a memory cell.

The program completion signal PGMNDP generated after the initial program operation is provided to the set program control circuit 200. Thereafter, the program completion signal PGMNDP is outputted as the set programming enable signal ERENP each time the count unit 220 down-counts an initial value to 0 such that the set data recording operation is performed.

Accordingly, units of 128 word lines are sequentially enabled in the erase mode of the 128 KB unit, and when recording the set data by the unit of 32 bits with the 128 word lines enabled, the set programming enable signal ERENP is enabled 32,768 times in total. Further, the word lines are enabled by being selected 512 times by the unit of 128, and when the set programming enable signal ERENP is enabled, the next word lines are selected by the address count signal CACNTCK and precharge for the currently erased word lines may be performed.

While certain embodiments have been described above, it will be understood to those skilled in the art that the embodiments described are by way of example only. Accordingly, the semiconductor memory apparatus, and the set program control circuit and the program method therefor described herein should not be limited based on the described embodiments. Rather, the semiconductor memory apparatus, and the set program control circuit and the program method therefor described herein should be understood in light of the claims that follow when taken in conjunction with the above description and accompanying drawings.

What is claimed is:

1. A semiconductor memory apparatus comprising:
    a program pulse generation block configured to generate a first write control signal, second write control signal and a program completion signal in response to a programming enable signal;
    a set program control circuit configured to repeatedly generate a set programming enable signal a predetermined number of times in response to an erase command and the program completion signal; and
    a controller configured to disable the first write control signal in response to the erase command and generate the programming enable signal in response to the set programming enable signal.

2. The semiconductor memory apparatus according to claim 1,
    wherein the controller generates the programming enable signal each time the set programming enable signal is enabled, and
    wherein the program pulse generation block generates the second write control signal each time the programming enable signal is enabled, and generates the program completion signal when an operation for generating the second write control signal is completed.

3. The semiconductor memory apparatus according to claim 1, wherein the set program control circuit generates the set programming enable signal a number of times that is set according to a basic unit of an erase operation and a set data recording unit.

4. The semiconductor memory apparatus according to claim 3, wherein the set program control circuit performs counting with an initial value obtained by dividing the basic unit of the erase operation by the set data recording unit, and outputs the set programming enable signal each time the counting is performed.

5. The semiconductor memory apparatus according to claim 3, wherein the set program control circuit generates an address counting signal and a word line precharge signal after performing the counting a number of times corresponding to a number of word lines which are simultaneously selected.

6. The semiconductor memory apparatus according to claim 3, wherein the set program control circuit enables an erase period enable signal in response to the erase command, and generates an erase end signal when a final counting operation is performed and provides the erase end signal to the controller.

7. The semiconductor memory apparatus according to claim 1, further comprising:
    a write driver configured to generate program current corresponding to the first write control signal and the second write control signal, and program data to a memory block.

8. The semiconductor memory apparatus according to claim 7,
    wherein the program pulse generation bock generates the second write control signal each time the set programming enable signal is enabled, and
    wherein the write driver receives a plurality of set data, and as a predetermined number of word lines are simultaneously driven, programs the data to the memory block which is connected to the driven word lines.

9. The semiconductor memory apparatus according to claim 7, wherein the memory block includes a plurality of memory cells in and from which data are recorded and sensed in a current driving scheme.

10. A semiconductor memory apparatus comprising:
    a set program control circuit configured to generate a set programming enable signal in response to an erase command and a program completion signal;
    a program pulse generation block configured to output a first write control signal and second write control signal according to a programming enable signal which is generated in response to the set programming enable signal; and
    a write driver configured to provide a program pulse generated in response to the first write control signal and the second write control signal, to a memory block.

11. The semiconductor memory apparatus according to claim 10, wherein the set programming enable signal is enabled in correspondence to a number of times which is determined according to a basic unit of an erase operation and a set data recording unit.

12. The semiconductor memory apparatus according to claim 11, wherein the set program control circuit performs counting with an initial value obtained by dividing the basic unit of the erase operation by the set data recording unit, and outputs the set programming enable signal each time the counting is performed.

13. The semiconductor memory apparatus according to claim 10,
    wherein the write control signal include the first write control signal for programming data of a first level and the second write control signal for programming data of a second level, and
    wherein the semiconductor memory apparatus further comprises:
    a controller configured to disable the first write control signal in response to the erase command.

14. A set program control circuit,
    wherein the set program control circuit is connected with a program pulse generation block which generates a program completion signal, in response to a programming enable signal which is generated according to a set programming enable signal, and
    wherein the set program control circuit generates the set programming enable signal in response to an erase command and the program completion signal.

15. The set program control circuit according to claim 14, wherein the set program control circuit performs counting with an initial value obtained by dividing a basic unit of an erase operation by a set data recording unit, and outputs the set programming enable signal each time the counting is performed.

16. The set program control circuit according to claim 14, wherein the set program control circuit comprises:

a control signal generation unit configured to generate a number of erase times count signal and an erase clock signal in response to the erase command, the program completion signal and a count enable signal, and generate an erase enable signal in response to an erase mode set signal;

a count unit configured to output counting signals through a counting operation in response to the number of erase times count signal, the erase clock signal and the erase enable signal which are provided from the control signal generation unit;

a set program pulse generation unit configured to generate an erase period enable signal in response to the erase mode set signal, and output the set programming enable signal in response to the erase period enable signal, the programming enable signal and the program completion signal; and a mode determination unit configured to generate an erase end signal in response to the counting signals and the erase period enable signal.

17. The set program control circuit according to claim 16, wherein the number of erase times count signal, the erase clock signal and the erase enable signal are respectively enabled in a state in which a suspend signal is disabled.

18. The set program control circuit according to claim 16, wherein the set program pulse generation unit comprises:
a period setting section configured to generate the erase period enable signal which is enabled in response to the erase mode set signal and is disabled according to a final counting operation of the count unit; and
a pulse outputting section configured to output the programming enable signal or the program completion signal as the set programming enable signal in response to the erase period enable signal.

19. The set program control circuit according to claim 18, wherein the pulse outputting section generates an address count signal in response to the erase period enable signal and the program completion signal and provides the address count signal to the mode determination unit.

20. The set program control circuit according to claim 19, wherein the mode determination unit further generates a word line precharge signal in response to the counting signals, the erase period enable signal and the address count signal.

21. The set program control circuit according to claim 20, wherein the mode determination unit generates the word line precharge signal as a predetermined number of word lines to be simultaneously enabled is counted.

22. The set program control circuit according to claim 14, wherein the program pulse generation block generates write control signal by the programming enable signal and provides the write control signal to a write driver.

23. A program method for a semiconductor memory apparatus, comprising:
inputting set data to a semiconductor memory apparatus having a program pulse generation block;
repeatedly generating a programming enable signal a number of times that is determined according to a basic unit of an erase operation and a set data recording unit, by the program pulse generation block; and
programming data to a selected region of a memory block by a write driver, in response to the programming enable signal.

24. The method according to claim 23, wherein the data is programmed to the selected region of the memory block according to write control signal which are generated in response to the programming enable signal, and
wherein the method further comprises:
outputting a program completion signal by the program pulse generation block after the write control signal are generated.

25. The method according to claim 24, wherein the programming enable signal is generated according to a set programming enable signal which is generated in response to the program completion signal.

26. The method according to claim 23, wherein repeatedly generating of the programming enable signal comprises:
performing sequential counting with an initial value obtained by dividing the basic unit of the erase operation by the set data recording unit; and
generating the programming enable signal each time the counting is performed.

27. The method according to claim 26, wherein the performing of the counting comprises:
performing down-counting from initial count signals.

28. The method according to claim 26, further comprising:
generating a word line precharge signal as a predetermined number of word lines to be simultaneously enabled is counted after the write driver programs the data to the selected region of the memory block.

* * * * *